US012663476B2

(12) United States Patent
Lee et al.

(10) Patent No.: US 12,663,476 B2
(45) Date of Patent: Jun. 23, 2026

(54) BATTERY SYSTEM

(71) Applicants: SK ON CO., LTD., Seoul (KR);
AUTOSILICON INC., Seoul (KR)

(72) Inventors: Jae Hee Lee, Daejeon (KR); Woo Jung Kim, Daejeon (KR); Ki Man La, Daejeon (KR); Sang Hae Park, Daejeon (KR); Jeong Min Seo, Daejeon (KR); Ki Bum Sung, Daejeon (KR); Ho Sang Jang, Daejeon (KR); Dong Hyeon Kim, Seoul (KR); Ji Hun Kim, Seoul (KR); Myoung Su Song, Seoul (KR)

(73) Assignees: SK ON CO., LTD., Seoul (KR);
AUTOSILICON INC., Seoul (KR)

( * ) Notice: Subject to any disclaimer, the term of this patent is extended or adjusted under 35 U.S.C. 154(b) by 637 days.

(21) Appl. No.: 18/089,446

(22) Filed: Dec. 27, 2022

(65) Prior Publication Data

US 2023/0204671 A1 Jun. 29, 2023

(30) Foreign Application Priority Data

Dec. 28, 2021 (KR) ........................ 10-2021-0189904

(51) Int. Cl.
*G01R 31/382* (2019.01)
*G01R 31/396* (2019.01)
(Continued)

(52) U.S. Cl.
CPC ......... *G01R 31/382* (2019.01); *G01R 31/396* (2019.01); *G01R 31/367* (2019.01); *H01M 10/4207* (2013.01); *H04Q 9/00* (2013.01)

(58) Field of Classification Search
USPC .......................................................... 702/63
See application file for complete search history.

(56) References Cited

U.S. PATENT DOCUMENTS

2012/0203482 A1* 8/2012 Parle .................. G01R 31/3835
702/63
2013/0260213 A1* 10/2013 Takahashi ........... H01M 50/204
429/159
(Continued)

FOREIGN PATENT DOCUMENTS

CN 110661305 A 1/2020
KR 10-2014-0143076 A 12/2014
(Continued)

OTHER PUBLICATIONS

First Office Action for Chinese Patent Application No. 202211691644.0, issued on Apr. 29, 2026 (17 pages).

*Primary Examiner* — Paul D Lee
(74) *Attorney, Agent, or Firm* — Perkins Coie LLP

(57) ABSTRACT

A battery system includes first to N-th battery modules sequentially connected in a daisy chain configuration; and a master controller connected to the first battery module through an interface IC, selecting at least one target module among the first to N-th battery modules, and transmitting a control command for the target module. The target module unidirectionally transmits the control command received from the master controller, and bidirectionally transmits response data generated in response to the control command. The master controller selects the N-th battery module as the target module first, and selects the first battery module as the target module last.

7 Claims, 10 Drawing Sheets

(51) Int. Cl.

| | | |
|---|---|---|
| *G01R 31/367* | (2019.01) | |
| *H01M 10/42* | (2006.01) | |
| *H04Q 9/00* | (2006.01) | |

(56) References Cited

U.S. PATENT DOCUMENTS

| | | | |
|---|---|---|---|
| 2014/0365792 A1 | 12/2014 | Yun | |
| 2016/0261127 A1* | 9/2016 | Worry ................... | H02J 7/0029 |
| 2017/0077558 A1* | 3/2017 | Nystrom ................. | B60L 58/22 |
| 2017/0158059 A1* | 6/2017 | Dai ........................... | B32B 7/04 |
| 2017/0346308 A1 | 11/2017 | Kain et al. | |
| 2017/0358936 A1* | 12/2017 | Kang ................. | H01M 10/482 |
| 2019/0227863 A1 | 7/2019 | Cho et al. | |
| 2019/0229376 A1* | 7/2019 | Petrakivskyi .......... | G08C 23/04 |
| 2020/0006955 A1 | 1/2020 | Cai et al. | |
| 2020/0092135 A1 | 3/2020 | Yeo et al. | |
| 2022/0029429 A1* | 1/2022 | Trippel ................. | H02J 7/0014 |

FOREIGN PATENT DOCUMENTS

| | | |
|---|---|---|
| KR | 10-2018-0053056 A | 5/2018 |
| KR | 10-2019-0089457 A | 7/2019 |
| KR | 10-2020-0032415 A | 3/2020 |
| KR | 10-2020-0066588 A | 6/2020 |
| WO | 2019/006204 A1 | 1/2019 |

* cited by examiner

BATTERY SYSTEM

CROSS-REFERENCE TO RELATED APPLICATION(S)

This patent document claims benefit of priority to Korean Patent Application No. 10-2021-0189904 filed on Dec. 28, 2021 in the Korean Intellectual Property Office, the disclosure of which is incorporated herein by reference in its entirety.

TECHNICAL FIELD

The present disclosure relates to a battery system.

BACKGROUND

The battery system may include a battery management unit including a master controller and a plurality of battery modules controlled by the battery management unit. The plurality of battery modules may be connected to each other in a daisy chain configuration and may operate in response to a control command from the battery management unit. Since a plurality of battery modules are connected to each other by a daisy chain configuration, a battery module directly connected to the battery management unit may send and receive relatively more data than other battery modules in communication between the battery management unit and the plurality of battery modules. Accordingly, a difference in power consumption between the plurality of battery modules may increase, which may cause problems such as deterioration of the performance of the battery system and a reduction in driving range.

SUMMARY

An aspect of the present disclosure is to provide a battery system in which a difference in power consumption of a plurality of battery modules in communication between a battery management unit and a plurality of battery modules may be significantly reduced.

According to an aspect of the present disclosure, a battery system includes first to N-th battery modules sequentially coupled in a daisy chain configuration; and a master controller coupled to the first battery module through an interface IC, configured to select at least one target module among the first to N-th battery modules, and transmit a control command for the target module. The target module unidirectionally transmits the control command received from the master controller, and bidirectionally transmits response data generated in response to the control command. The master controller selects the N-th battery module as the target module firstly, and selects the first battery module as the target module lastly.

According to an aspect of the present disclosure, a battery system includes a plurality of battery modules coupled to each other in a daisy chain configuration; and a master controller generating a control command for monitoring a state of the plurality of battery modules and transmit the control command to at least one of the plurality of battery modules. Each of the plurality of battery modules has priority, and bidirectionally transmits response data indicating the state in response to the control command, and the master controller firstly receives the response data of a highest order battery module having a highest priority among the plurality of battery modules.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

The details of other embodiments are included in the detailed description and drawings.

Advantages and features of the present disclosure and methods of achieving them will become apparent with reference to the embodiments described below in detail in conjunction with the accompanying drawings. However, the present disclosure is not limited to the embodiments disclosed below, but may be implemented in various different forms.

Figure 1:
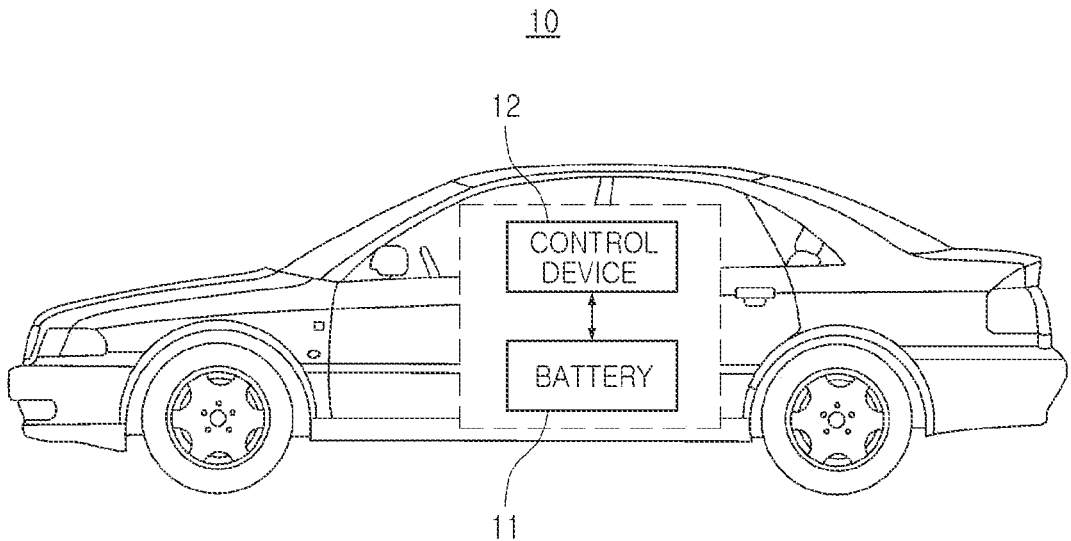
FIG. 1 is a schematic diagram of an electric vehicle equipped with a battery according to an embodiment.

FIG. 1 is a schematic diagram of an electric vehicle equipped with a battery according to an embodiment.

Referring to FIG. 1, an electric vehicle 10 may include a battery 11 and a control device 12. The control device 12 may be implemented as a battery management unit (BMU), and may include a master controller controlling the battery 11. According to an embodiment, the control device 12 may further include an interface integrated circuit (IC) mediating communication between the master controller and the battery 11. In addition, the control device 12 may monitor the state of charge and the remaining life of the battery 11 and output the same to the driver of the electric vehicle 10 on a display or the like.

The battery 11 may be implemented as a battery pack having a plurality of battery modules, and each of the plurality of battery modules may include a plurality of battery cells. For example, each of the plurality of battery cells includes a case, a positive electrode, and a negative electrode, and an electrolyte and a separator may be disposed between the positive electrode and the negative electrode in the case. When the battery 11 is a lithium ion battery, in the charging operation, lithium ions emitted from the positive electrode may be concentrated on the negative electrode through the separator, and in the discharging operation, lithium ions released from the negative electrode may pass through the separator and be concentrated on the positive electrode.

A plurality of battery modules may be coupled to each other in a daisy chain configuration. One battery module among the plurality of battery modules may be directly coupled to the control device 12, and the remaining battery modules may be coupled to the control device 12 through at least one other battery module.

Accordingly, at least one other battery module must intervene in communication between the control device 12 and the battery module that is not directly coupled to the control device 12. For example, when the plurality of battery modules include a first battery module directly coupled to the control device 12 and a second battery module coupled to the first battery module, the second battery module and the control device 12. The first battery module may intervene in the communication of For example, when the control device 12 generates a control command targeting the second battery module, the control command may be transmitted to the second battery module through the first battery module. In addition, response data generated by the second battery module in response to the control command may also be transmitted to the control device 12 through the first battery module.

The first battery module has no choice but to intervene in the communication between the control device 12 and the remaining battery modules except for the first battery module among the plurality of battery modules, and as a result, the communication between the battery 11 and the control device 12. In, the power consumption of the first battery module is inevitably greater than the power consumption of each of the remaining battery modules. Accordingly, an imbalance in power consumption between the battery modules may occur, which may result in deterioration of the battery system performance.

In an embodiment, in communication between the battery 11 and the control device 12, each of the plurality of battery modules additionally transmits a control command and response data, thereby minimizing the difference in power consumption between the battery modules. In the example described above, the second battery module receiving the control command generated by the control device 12 through the first battery module sends a control command to another battery module coupled to the second battery module, for example, the third battery module. In this case, since the third battery module is not the target module of the control command, an operation such as generating response data to the control command may not be executed.

Also, in the example described above, the second battery module may bi-directionally transmit response data generated to the control command to the first battery module and the third battery module. The first battery module may transmit the response data to the control device 12, and the third battery module may transmit the response data to another battery module, for example, the fourth battery module. Alternatively, when another battery module is not coupled to the third battery module, the third battery module may transmit response data to the dummy load or may output response data to a terminated communication port. Accordingly, in communication for exchanging control commands and response data, a difference in power consumption of each of the plurality of battery modules may be reduced, and performance of the battery system may be improved.

Figure 2:
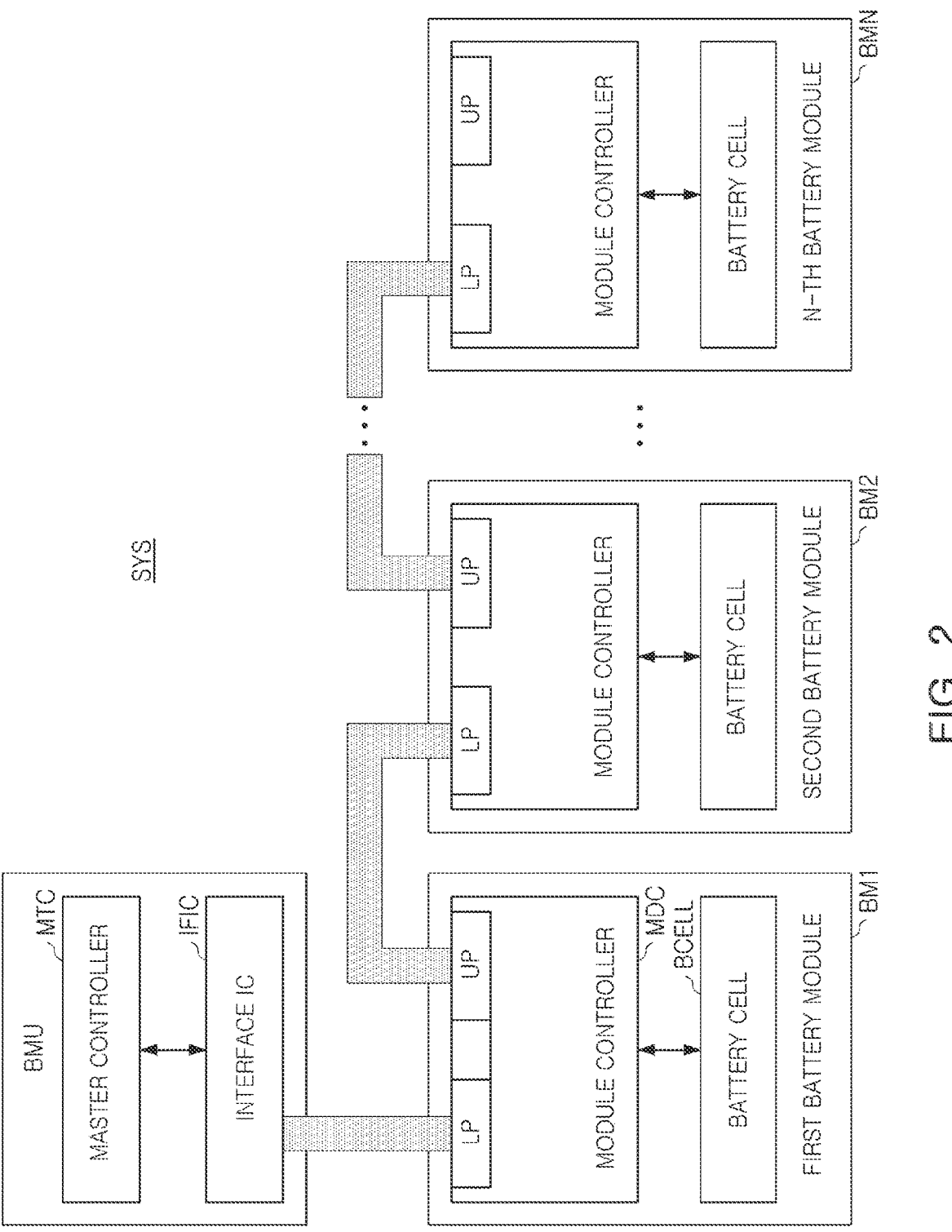
FIGS. 2, 3A, and 3B are diagrams schematically illustrating battery systems according to embodiments.
Figure 3A:
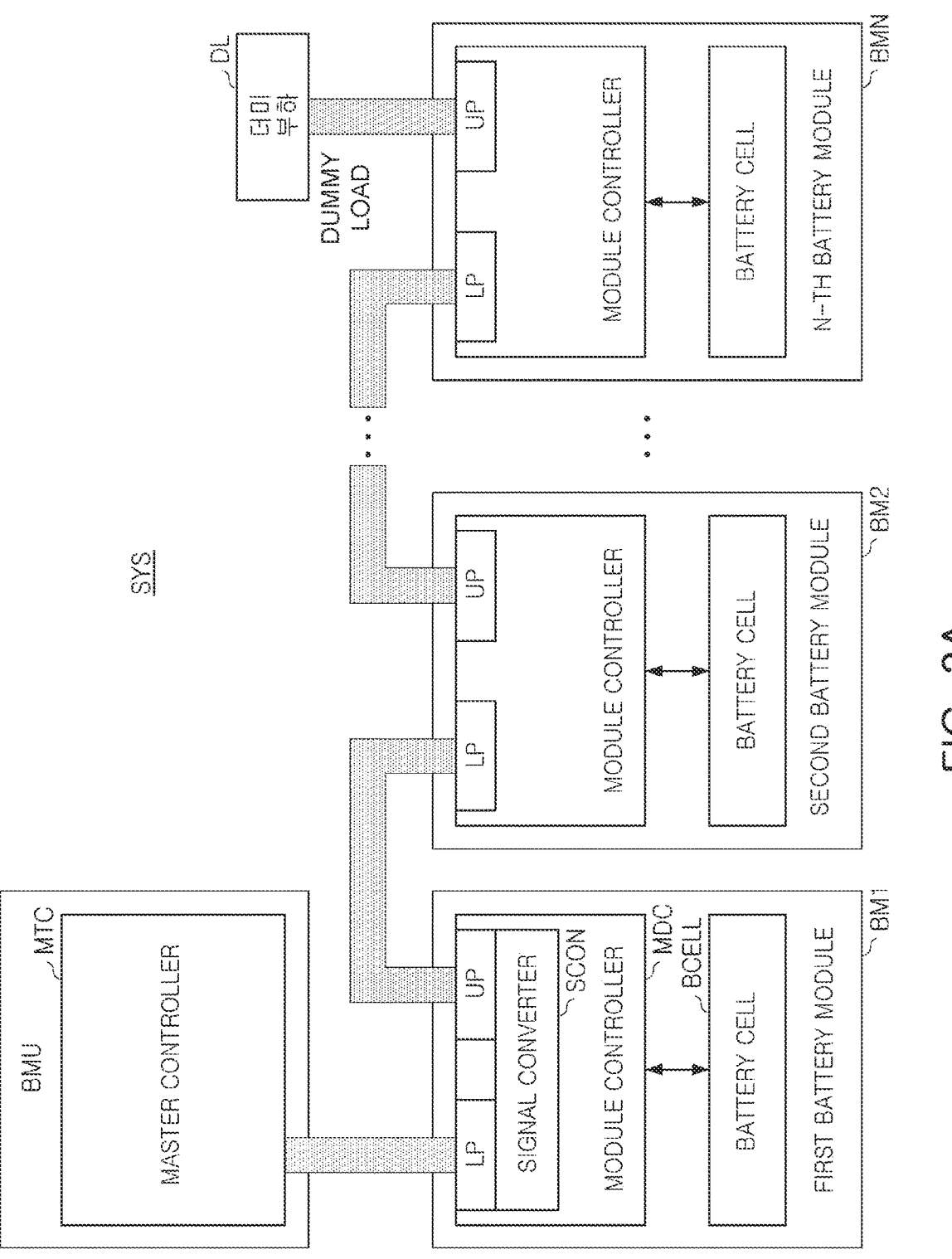
Figure 3B:
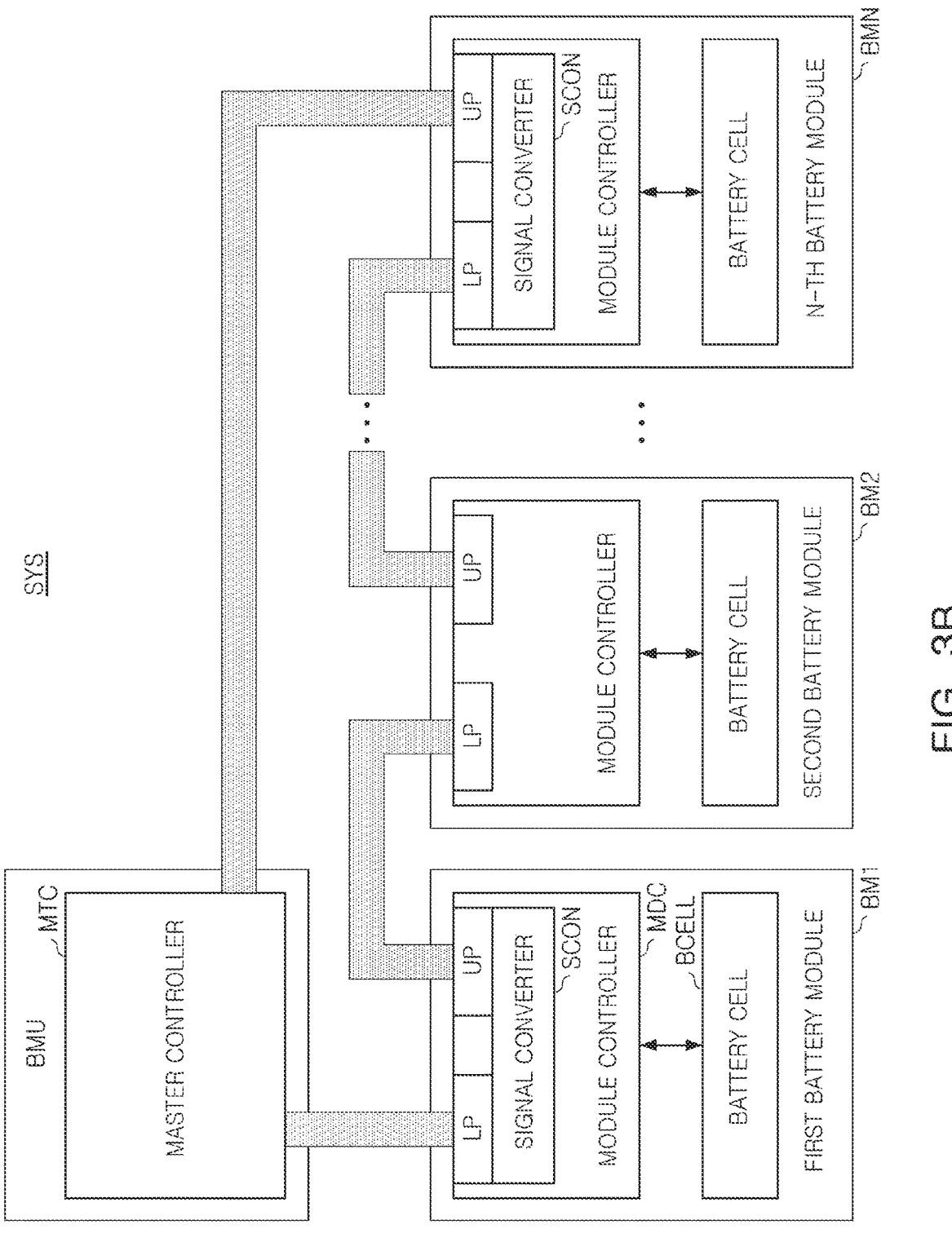

FIGS. 2, 3A, and 3B are diagrams schematically illustrating battery systems according to embodiments.

Referring to FIG. 2 first, the battery system SYS according to an embodiment may include a battery management unit BMU and a plurality of battery modules BM1-BMN. The plurality of battery modules BM1-BMN may be coupled in series to each other in a daisy chain configuration, and the first battery module BM1 may be directly coupled to the battery management unit BMU.

Each of the plurality of battery modules BM1-BMN may have a structure similar to each other. For example, the first battery module BM1 may include battery cells BCELL and a module controller MDC, and the module controller MDC may include two communication ports LP and UP. In an embodiment, the module controller MDC may include a lower communication port LP and an upper communication port UP, and a lower communication port LP and an upper level communication port LP of each of the plurality of battery modules BM1-BMN. The plurality of battery modules BM1-BMN may be coupled to each other in a daisy chain configuration by the communication port UP, and the first battery module BM1 may be coupled to the battery management unit BMU.

However, the upper communication port UP of the N-th battery module BMN coupled farthest from the battery management unit BMU among the plurality of battery modules BM1-BMN may not be coupled to another battery module. In the embodiment illustrated in FIG. 2, the upper communication port UP of the N-th battery module BMN is not coupled to other battery modules and may be terminated.

Referring to FIG. 2, the battery management unit (BMU) may include a master controller (MTC), an interface IC (IFIC), and the like. Interface ICs (IFICs) may convert differential signals and single-ended signals to and from each other. For example, the interface IC (IFIC) mediates communication between the master controller (MTC) and the module controller (MDC) of the first battery module (BM1) by converting a single-ended signal UART signal and/or SPI signal into a differential signal.

The master controller MTC may generate various control commands to control the plurality of battery modules BM1-BMN. For example, the master controller MTC may generate a sensing control command for determining the charging state of at least one target module among the plurality of battery modules BM1-BMN. The target module may generate response data indicating the current state of charge in response to the sensing control command, and transmit the same to the master controller (MTC).

As described above, since the plurality of battery modules BM1-BMN are coupled in a daisy chain configuration, power consumption by communication may be large in a battery module close to the battery management unit BMU in general. As a result, power consumption due to communication between the plurality of battery modules BM1-BMN and the battery management unit BMU inevitably has a difference in the plurality of battery modules BM1-BMN, and as a result, the battery system (SYS) performance may be degraded.

In an embodiment, the control command generated by the master controller (MTC) is transmitted to the last battery module, the N-th battery module (BMN), regardless of the location of the target module, and the response data generated by the target module is bidirectional. By transmitting to, it is possible to minimize the power consumption deviation as described above. For example, when the master controller MTC generates and transmits a control command designating the first battery module BM1 as a target module, the first battery module BM1 is also transmitted to the second battery module BM2 irrelevant to the control command. Control commands may be sent. The second battery module BM2 transmits a control command to the next battery module, and the control command may be transmitted to the N-th battery module BMN. The N-th battery module BMN may execute an operation of transmitting a control command through the terminated upper communication port UP. Accordingly, the operation of transmitting the control command to all of the plurality of battery modules BM1-BMN may be performed once, and a deviation in power consumption between the plurality of battery modules BM1-BMN may be minimized.

On the other hand, the first battery module BM1 may generate response data in response to the control command, and may transmit the response data in both directions. Accordingly, the response data of the first battery module BM1 may be transmitted to the battery management unit BMU and the second battery module BM2. The master controller MTC of the battery management unit BMU may determine the state of the first battery module BM1 with reference to the response data. On the other hand, the second battery module BM2 may transmit response data to the next battery module, and the response data may be transmitted to the N-th battery module BMN. The N-th battery module BMN may perform an operation of transmitting response data through the terminated upper communication port UP. Accordingly, all of the plurality of battery modules BM1 to BMN may perform an operation of transmitting response data at least once, and it is possible to minimize a difference in power consumption between the plurality of battery modules BM1 to BMN.

Next, referring to FIGS. 3A and 3B, in the battery system SYS, the battery management unit BMU may not include the interface IC IFIC. Instead, in the embodiments illustrated in FIGS. 3A and 3B, the module controller MDC included in the first battery module BM1 may include the signal conversion unit SCON. The signal converter SCON may mutually convert a single-ended signal and a differential signal between the lower communication port LP and the upper communication port UP of the first battery module BM1. For example, the signal converter SCON may convert a signal received from the master controller MTC into a signal suitable for a daisy communication protocol connecting the plurality of battery modules BM1-BMN. Also, the signal conversion unit SCON may convert a signal received from the second battery module BM2 into a signal suitable for communication with the master controller MTC.

Referring to FIG. 3A, the upper communication port UP of the N-th battery module BMN may be coupled to the dummy load DL. Accordingly, in the operation example described above with reference to FIG. 2, the N-th battery module BMN may transmit the control command and response data to the dummy load DL through the upper communication port UP.

Referring to FIG. 3B, the upper communication port UP of the N-th battery module BMN may be coupled to the master controller MTC rather than the dummy load. In detail, the master controller MTC may be coupled to the lower communication port DP of the first battery module BM1 and the upper communication port UP of the N-th battery module BMN. The N-th battery module BMN may output a signal to the master controller MTC through the upper communication port UP, and thus the battery system SYS may have a cyclic structure. The N-th battery module BMN may include a signal converter SCON to transmit a signal to the master controller MTC through the upper communication port UP. For example, the signal conversion unit SCON of the N-th battery module BMN may convert a signal received according to a daisy communication protocol into a signal suitable for communication with the master controller MTC.

On the other hand, the battery system SYS according to an embodiment is not limited to the embodiments described with reference to FIGS. 2, 3A and 3B. For example, the plurality of battery modules BM1-BMN are coupled to the battery management unit BMU including the interface IC IFIC, and the upper communication port UP of the N-th battery module BMN is a dummy load. (DL) or interface IC (IFIC). Alternatively, a plurality of battery modules BM1-BMN are coupled to a battery management unit BMU that does not include an interface IC IFIC, and the first battery module BM1 includes a signal converter SCON, The upper communication port UP of the N-th battery module BMN may be terminated instead of being coupled to the dummy load DL.

FIGS. 4 to 7 are diagrams illustrating a method of operating a battery system according to embodiments.

Referring to FIGS. 4 to 7, the battery system 100 according to an embodiment may include a master controller 110, a plurality of battery modules 120 to 140, and a dummy load 150. The master controller 110 controls the plurality of battery modules 120-140 by generating various control commands, and the plurality of battery modules 120-140 may be connected to each other in a daisy chain configuration. Accordingly, one of the plurality of battery modules 120 to 140, for example, the first battery module 120 is directly connected to the master controller 110, and the second and third battery modules 130 and 140 may communicate with the master controller 110 through the first battery module 120. On the other hand, the dummy load 150 may be connected to the third battery module 140.

Figure 4:
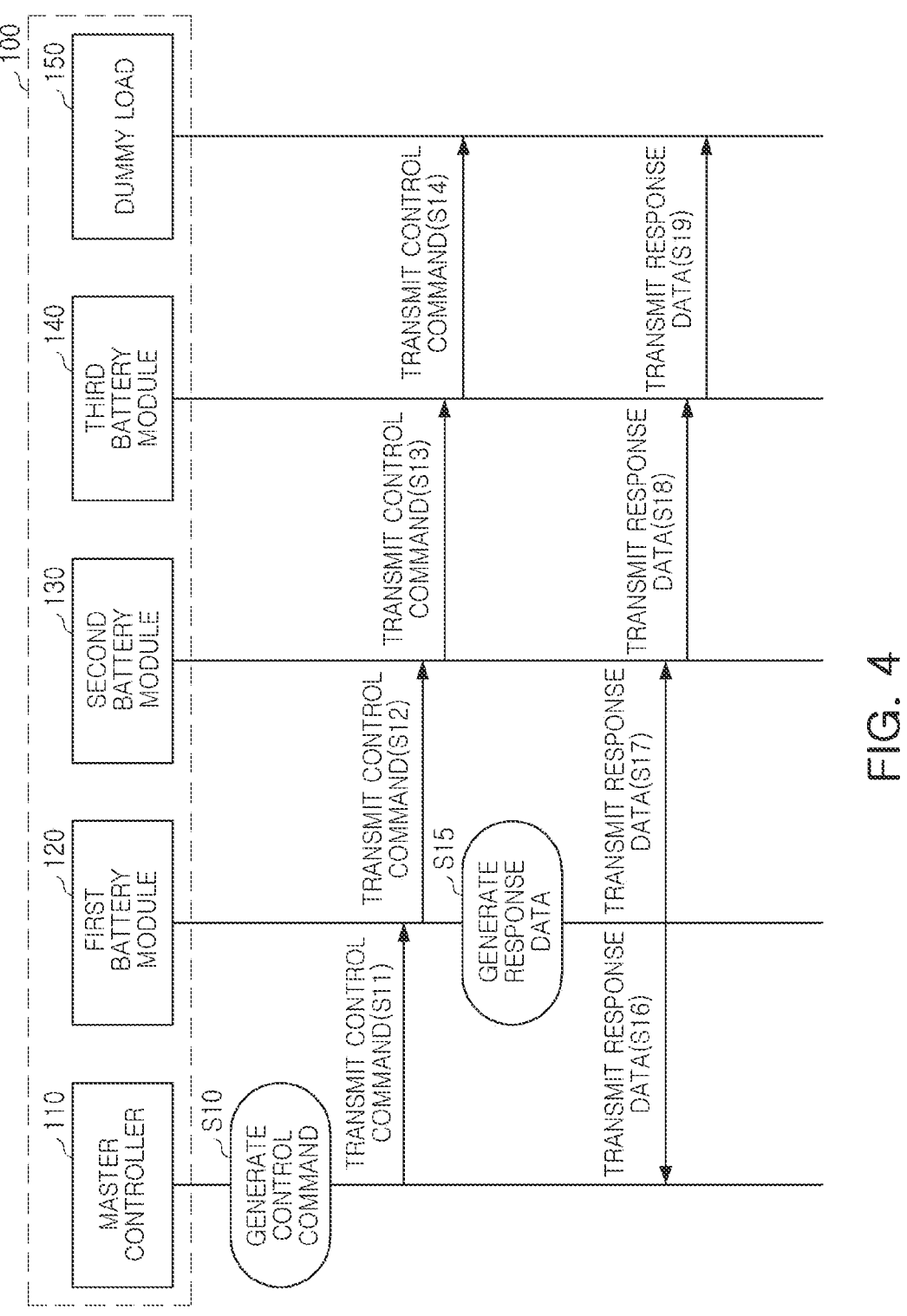
FIGS. 4 to 7 are diagrams illustrating a method of operating a battery system according to embodiments.

FIG. 4 may be a diagram illustrating an embodiment in which the master controller 110 selects the first battery module 120 as a target module. Referring to FIG. 4, the master controller 110 may generate a control command (S10) and transmit the same to the first battery module 120 (S11). The first battery module 120 may transmit the control command again to the second battery module 130 even though the target module of the control command received from the master controller 110 is itself (S12).

The second battery module 130 may transmit the control command back to the third battery module 140 (S13), and the third battery module 140 may execute an operation of outputting the control command to the dummy load 150. (S14). Through the above process, each of the plurality of battery modules 120 to 140 may perform the operation of receiving the control command and the operation of transmitting the control command once.

On the other hand, the first battery module 120 may generate response data in response to the control command (S15) and transmit the response data in both directions. For example, the first battery module 120 may transmit the response data to the master controller 110 (S16) and, at the same time, transmit the response data to the second battery module 130 (S17). Upon receiving the response data, the second battery module 130 transmits the same to the third battery module 140 (S18), and the third battery module 140 may transmit the response data to the dummy load 150 (S19). Accordingly, in addition to the first battery module 120 directly generating the response data, the second and third battery modules 130 and 140 may also perform an operation of transmitting the response data.

As described with reference to FIG. 4, in the battery system according to an embodiment, other battery modules (130 and 140 may also perform an operation of transmitting a control command to another module and an operation of transmitting response data. Accordingly, it is possible to minimize the difference in power consumption between the battery modules 120 to 140, and to improve the lifespan and performance of the battery system 100.

Referring to FIG. 4, the first battery module 120, which is the target module, may transmit a control command to the second battery module 130, and may transmit response data to the master controller 110. Accordingly, in the target module, the transmission direction of the control command and the transmission direction of the response data may be different. On the other hand, the remaining battery modules excluding the target module, for example, each of the second and third battery modules 130 and 140 may transmit the control command and the response data in the same direction. In addition, while the first battery module 120, the target module, transmits response data in both directions, each of the second and third battery modules 130 and 140 corresponding to the remaining battery modules transmit a control command and response data, and may only transmit in one direction.

Figure 5:
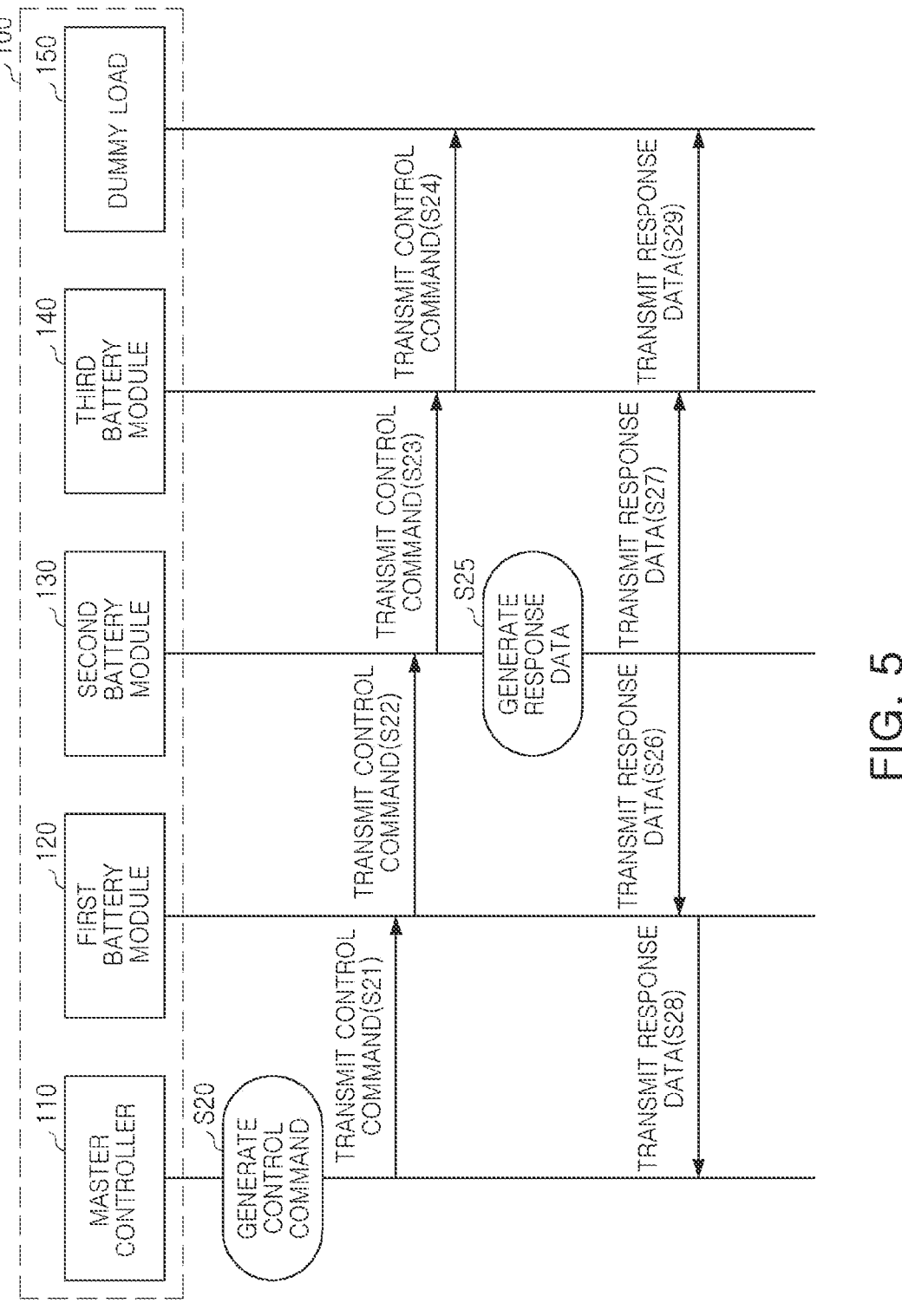

FIG. 5 may be a diagram illustrating an embodiment in which the master controller 110 selects the second battery module 130 as a target module. The master controller 110 may generate a control command (S20) and transmit the same to the first battery module 120 (S21). Since the plurality of battery modules 120 to 140 are connected to each other in a daisy chain configuration, a control command may be transmitted to the second battery module 130 by the first battery module 120 (S22).

On the other hand, the second battery module 130 transmits the control command back to the third battery module 140 even though the target module designated by the control command is itself (S23), and the third battery module 140 controls An operation of outputting a command to the dummy load 150 may be executed (S24). Through the above process, each of the plurality of battery modules 120 to 140 may perform the operation of receiving the control command and the operation of transmitting the control command once.

On the other hand, the second battery module 130 may generate response data in response to the control command (S25) and transmit the response data in both directions. The second battery module 130 may transmit the response data to the first battery module 120 (S26) and, at the same time, transmit the response data to the third battery module 140 (S27). The first battery module 120 receiving the response data may transmit the same to the master controller 110 (S28). On the other hand, the third battery module 140 that has received the response data may transmit the same to the dummy load 150 (S29). Accordingly, in addition to the second battery module 130 directly generating the response data, the first and third battery modules 120 and 140 may also perform an operation for transmitting the response data, and as a result, a plurality of battery modules in the communication operation A variation in power consumed by the ones 120 to 140 may be minimized.

Referring to FIG. 5, in the case of the first battery module 120 connected between the target module, the second battery module 130 and the master controller 110, and receiving a control command before the second battery module 130, the direction of transmitting the control command and the direction of transmitting the response data may be opposite to each other. On the other hand, in the third battery module 140 that is connected after the second battery module 130 and receives the control command later than the second battery module, the direction in which the control command is transmitted and the direction in which the response data is transmitted may be the same.

Figure 6:
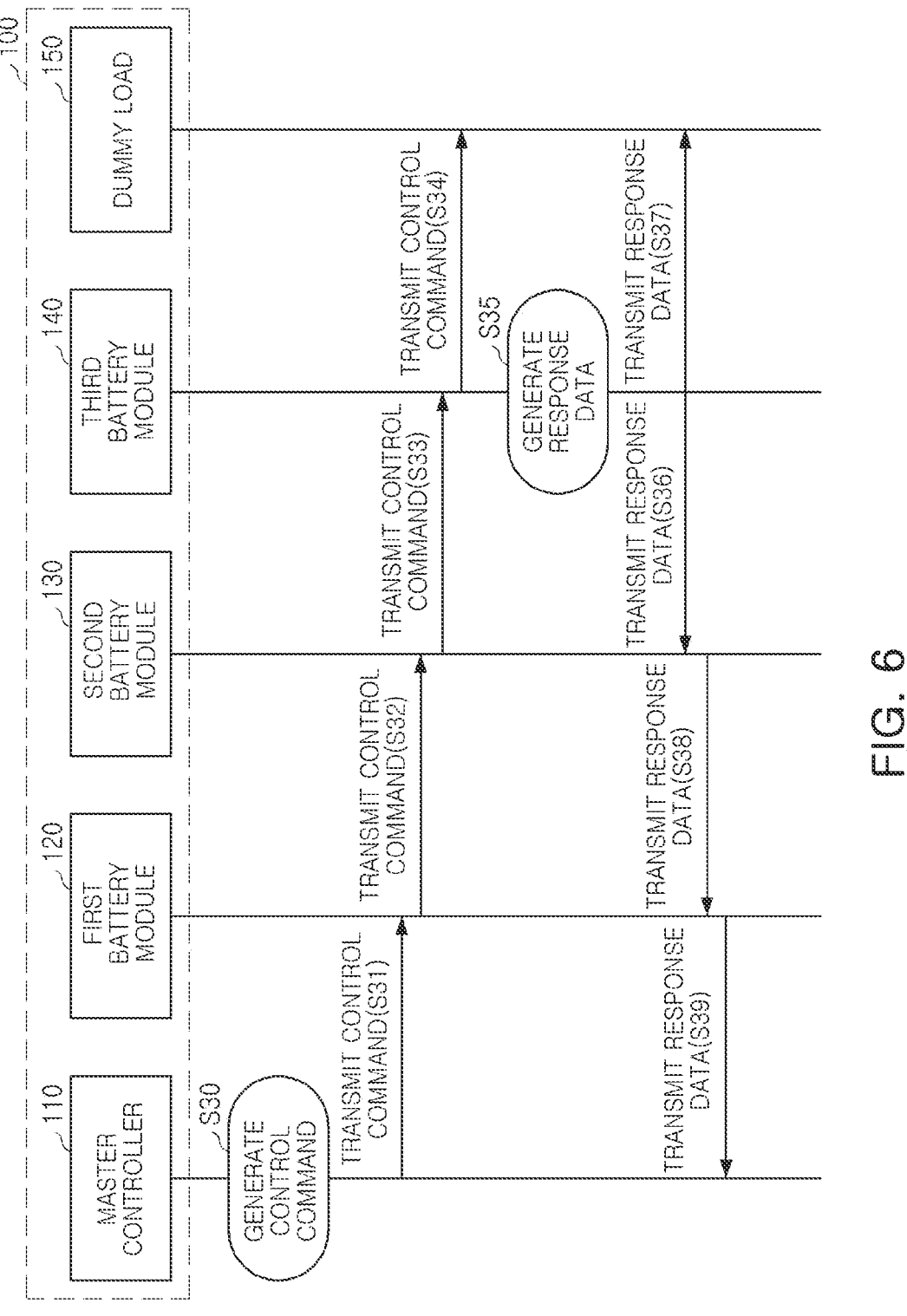

FIG. 6 may be a diagram illustrating an embodiment in which the master controller 110 selects the third battery module 140 as a target module. The master controller 110 may generate a control command targeting the third battery module 140 (S30), and transmit the same to the first battery module 120 firstly (S31). The first battery module 120 may transmit the control command received from the master controller 110 to the second battery module 130 (S32).

On the other hand, the second battery module 130 transmits the control command back to the third battery module 140 (S33), and the third battery module 140 transmits the control command to the dummy load (S33) even though the target module is itself. 150), an operation of re-transmitting may be executed (S34). Through the above process, each of the plurality of battery modules 120 to 140 may perform the operation of receiving the control command and the operation of transmitting the control command once. Accordingly, each of the plurality of battery modules 120 to 140 may consume substantially the same power regardless of a target module designated by the control command.

On the other hand, the third battery module 140 may generate response data in response to the control command (S35) and transmit the response data in both directions. In detail, the third battery module 140 transmits the response data to the second battery module 130 (S36) so that the master controller 110 may receive the response data, and also at the same time as the dummy load 150. Response data may be transmitted (S37). However, according to embodiments, when the third battery module 140 that is the last battery module among the plurality of battery modules 120 to 140 connected in a daisy chain configuration is the target module of the control command, the third battery module 140) may transmit the response data only to the second battery module 130 without transmitting the response data to the dummy load 150.

The second battery module 130 may transmit the response data to the first battery module 120 (S38), and the first battery module 120 may transmit the response data to the master controller 110 (S39). Accordingly, in addition to the third battery module 140 directly generating the response data, the first and second battery modules 120 and 130 may also perform an operation for transmitting the response data, and as a result, a plurality of battery modules in a communication operation A variation in power consumed by the ones 120 to 140 may be minimized.

Figure 7:
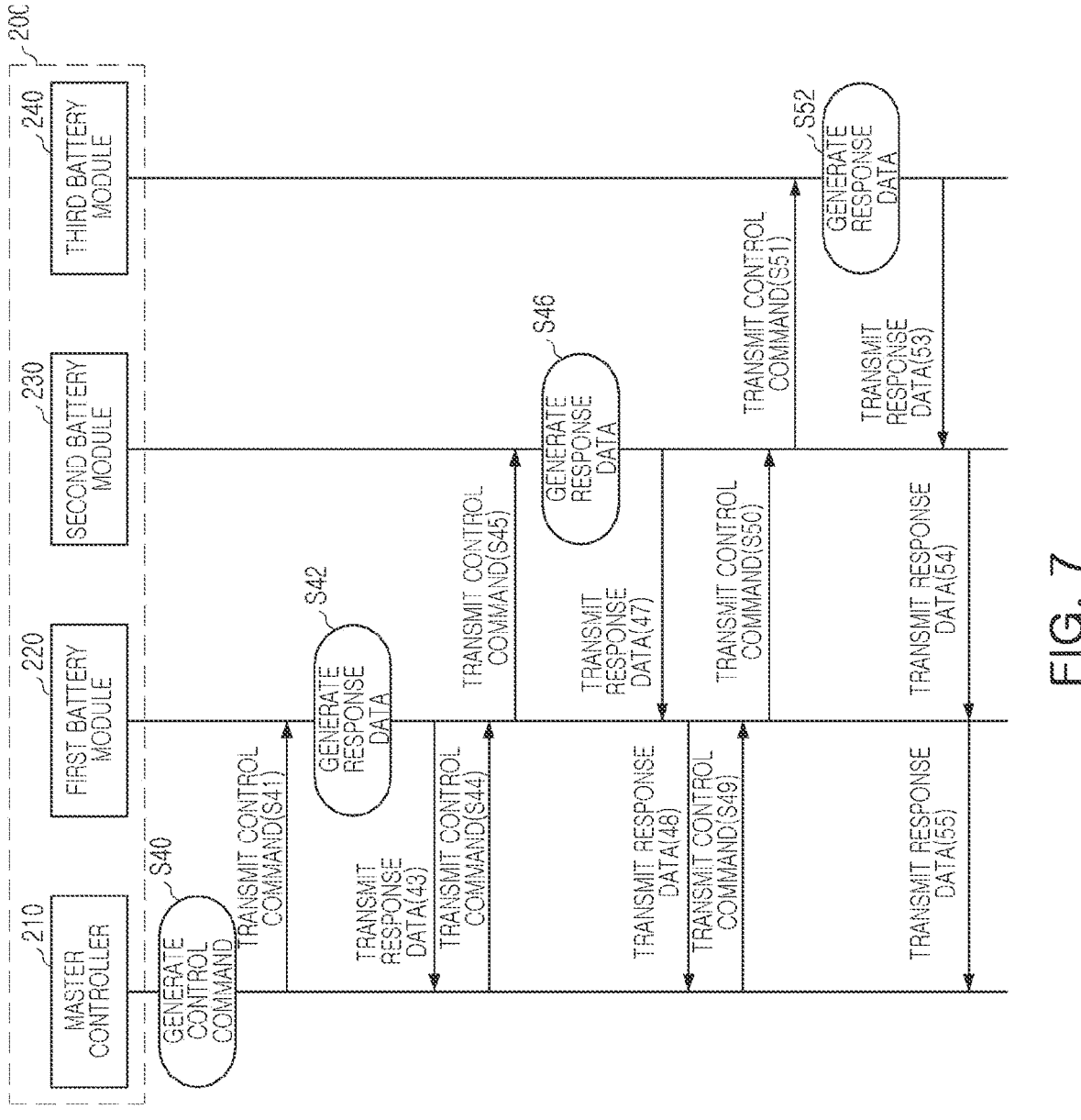

Next, FIG. 7 may be a diagram illustrating the operation of the battery system 200 according to the comparative example, which is different from the battery system 100 according to the embodiment described with reference to FIGS. 4 to 6 above. Referring to FIG. 7, the battery system 200 includes a master controller 210 and a plurality of battery modules 220-240, and the plurality of battery modules 220-240 are to be coupled to each other in a daisy chain configuration.

When the master controller 210 generates a control command (S40) and transmits the same to the first battery module 220 (S41), the first battery module 220 generates response data in response to the control command (S42)), and may transmit the generated response data to the master controller 210 (S43). On the other hand, when the master controller 210 transmits a control command for designating the second battery module 230 as a target module to the first battery module 220 (S44), the first battery module 220 issues the control command. 2 may be transmitted to the battery module 230 (S45). The second battery module 230 may generate response data (S46) and transmit the response data only to the first battery module 220 (S47). The master controller 210 may receive response data through the first battery module 220 (S48).

In addition, when the master controller 210 transmits a control command for designating the third battery module 240 as a target module to the first battery module 220 (S49), the first battery module 220 issues the control command. The second battery module 230 transmits the control command to the third battery module 240 (S50), and the second battery module 230 may transmit the control command to the third battery module 240 (551). The third battery module 240 may generate response data in response to the received control command (S52) and transmit the response data to the second battery module 230 (S53). The second battery module 230 may transmit to the first battery module 220 (S54), and the first battery module 220 may transmit response data to the master controller 210 (555).

Accordingly, in the battery system 200 according to the comparative example illustrated in FIG. 7, the master controller 210 transmits a control command to monitor the state of each of the plurality of battery modules 220-240 and receives response data. In this operation, the power consumption deviation of each of the plurality of battery modules 220-240 is inevitably increased. 7, in the process of receiving the response data of each of the plurality of battery modules 220-240, the first battery module 220 directly coupled to the master controller 210 consumes the most power, 3 The battery module 240 may consume the least power. Accordingly, the overall performance of the battery system 200 may be degraded.

On the other hand, in an embodiment, the battery module selected as the target module and receiving the control command may transmit the control command to the battery modules coupled between itself and the dummy load in a daisy chain method. In addition, response data generated by the battery module, which is the target module, may also be transmitted in both directions. Accordingly, it is possible to minimize the difference in power consumption between the plurality of battery modules and improve the performance and lifespan of the battery system.

Figure 8:
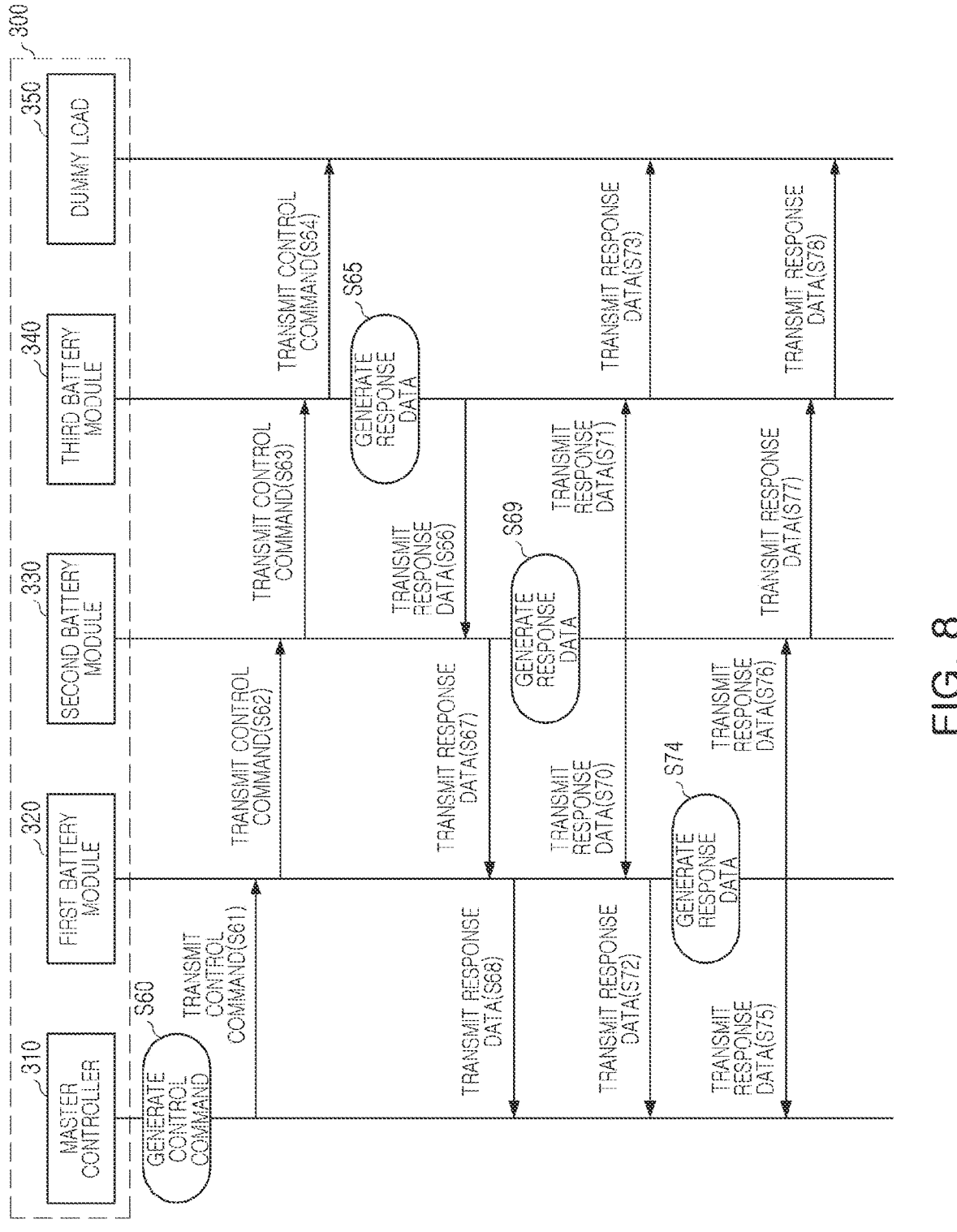
FIG. 8 is a diagram illustrating a method of operating a battery system according to an embodiment.

FIG. 8 is a diagram illustrating a method of operating a battery system according to an embodiment.

Referring to FIG. 8, the battery system 300 according to an embodiment may include a master controller 310, a plurality of battery modules 320-340, and a dummy load 350. The plurality of battery modules 320 to 340 may be coupled in a daisy chain configuration.

The master controller 310 may generate a control command for receiving response data from at least one target module among the plurality of battery modules 320 to 340 (S60). For example, the control command may be a command for monitoring a charging state of a target module among the plurality of battery modules 320-340. The master controller 310 may transmit a control command to the first battery module 320 (S61), and the first battery module 320 may transmit a control command to the second battery module 330 (S62). The third battery module 340 may receive a control command from the second battery module 330 (S63), and may perform an operation of transmitting the control command to the dummy load 350. Accordingly, each of the plurality of battery modules 320 to 340 may execute an operation of receiving and transmitting the control command once, and each of the plurality of battery modules 320 to 340 may receive it.

First, the third battery module 340 may generate response data as a response to the control command (S65). The response data is transmitted to the second battery module 330 (S66), and the second battery module 330 may transmit the response data to the first battery module 320 (S67). The master controller 310 may receive response data from the first battery module 320 (S68). Accordingly, while the response data of the third battery module 340 is transmitted to the master controller 310, the operation of transmitting the response data by each of the plurality of battery modules 320 to 340 may be performed once. On the other hand, according to an embodiment, the third battery module 340 may transmit the response data to the dummy load 350 in addition to the second battery module 330.

Next, the second battery module 330 may generate response data as a response to the control command (S69).

The second battery module 330 may bi-directionally transmit the response data to the third battery module 340 and the first battery module 320 (S70-S71). The first battery module 320 may transmit the response data of the second battery module 330 to the master controller 310 (S72), and the third battery module 340 may transmit the response data to the dummy load 350. There is (S73). Accordingly, while response data of the second battery module 330 is transmitted to the master controller 310, the third battery module 340 coupled between the second battery module 330 and the dummy load 350 also receives the response data. The sending operation may be executed.

Finally, as a response to the control command, the first battery module 320 may generate response data (S74). The first battery module 320 may transmit the response data to the master controller 310 at the same time (S75), and may also transmit the response data to the second battery module 330 (S76). The second battery module 330 transmits the response data of the first battery module 320 to the third battery module 340 (S77), and the third battery module 340 transmits the response data to the dummy load 350 (S78). Accordingly, while the response data of the first battery module 320 is transmitted to the master controller 310, the second and third battery modules 330 and 340 coupled between the first battery module 320 and the dummy load 350, may also perform an operation of transmitting response data, respectively.

As a result, in the embodiment illustrated in FIG. 8, each of the plurality of battery modules 320 to 340 generate response data in response to a control command and transmits the same to the master controller 310, while substantially the same power may be consumed. Accordingly, the lifespan and performance of the battery system 300 may be improved.

In addition, in an embodiment, the third battery module 340 coupled farthest from the master controller 310 firstly transmits response data to the master controller 310, so that the master controller 310 is a plurality of batteries. The time required for receiving response data from each of the modules 320 to 340 may be minimized. Hereinafter, it will be described in more detail with reference to FIG. 9.

Figure 9:
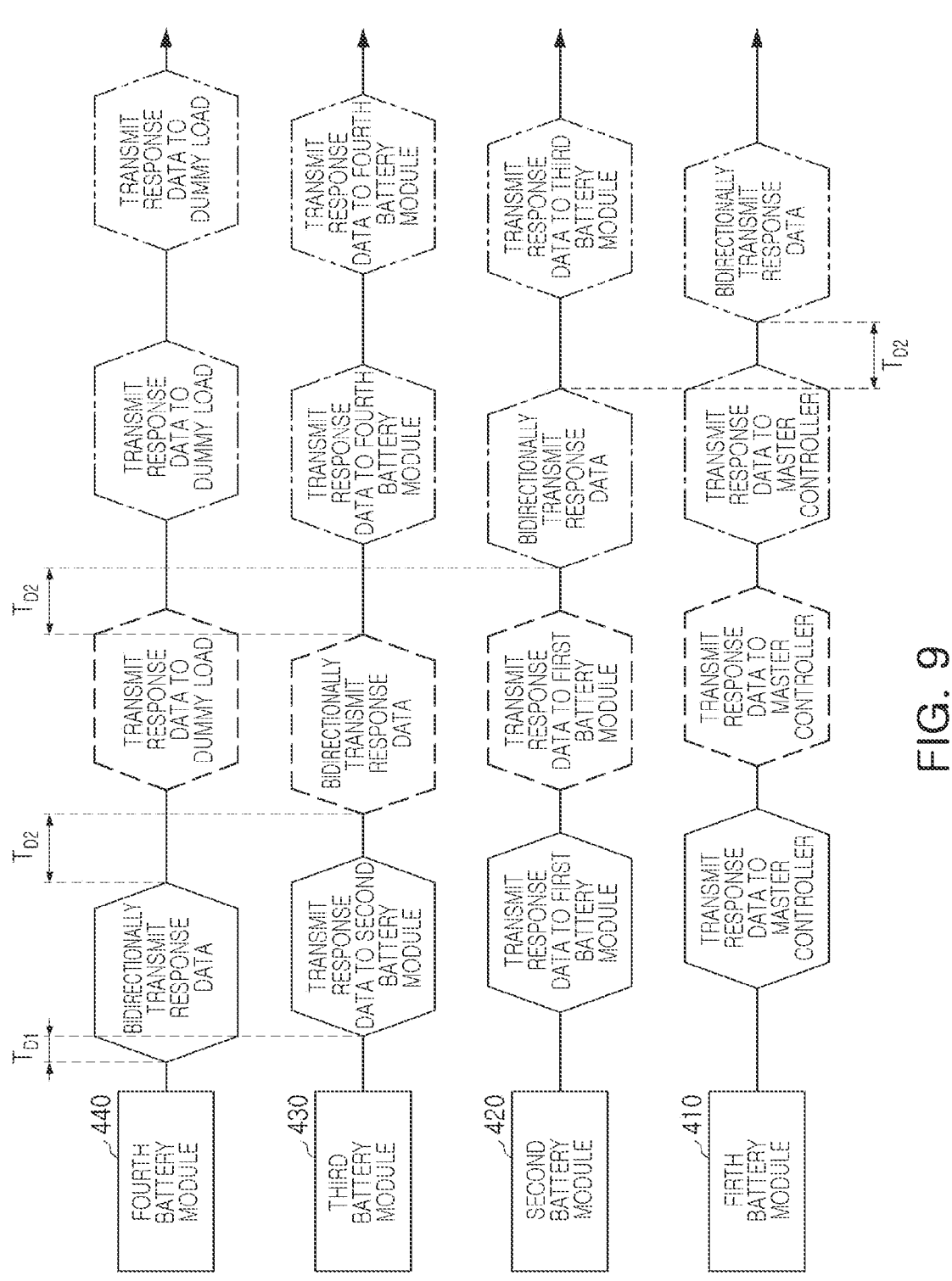
FIG. 9 is a diagram illustrating a method of operating a battery system according to an embodiment.

FIG. 9 is a diagram illustrating a method of operating a battery system according to an embodiment.

In the embodiment illustrated in FIG. 9, the battery system may include first to fourth battery modules 410-440. The first battery module 410 may be directly coupled to the master controller, and the first to fourth battery modules 410 to 440 may be sequentially coupled to the master controller in a daisy chain configuration. Also, the fourth battery module 440 may be coupled to a dummy load.

In the embodiment illustrated in FIG. 9, each of the first to fourth battery modules 410 to 440 may have a priority in their order of communicating with the mater controller. For example, the fourth battery module may be the highest order battery module having the highest priority, and the first battery module may be the lowest order battery module having the lowest priority. The priority of each of the first to fourth battery modules 410-440 may be determined according to the order of connection with the master controller, or may be determined irrespective of the order of connection.

When the master controller outputs a control command for monitoring the state of each of the first to fourth battery modules 410-440, the master controller transmits response data to each of the first to fourth battery modules 410-440, and the response data may be received according to the priority. For example, the master controller may receive the response data of the fourth battery module 440 having the highest priority firstly, and may receive the response data of the first battery module 410 having the lowest priority lastly.

Referring to FIG. 9, response data of the fourth battery module 440, which is the highest order battery module, may firstly be transmitted in both directions. For example, response data of the fourth battery module 440 may be transmitted to the third battery module 430 and the dummy load. At this time, after the first delay time TD1 corresponding to the propagation delay time has elapsed, the third battery module 430 may transmit the response data of the fourth battery module 440 to the second battery module 420. Similarly, the second battery module 420 may transmit the response data of the fourth battery module 440 to the first battery module 410 after the first delay time TD1 has elapsed, and the first battery module 410 may also transmit response data of the fourth battery module 440 to the master controller after the first delay time TD1 has elapsed. For example, the first delay time TD1 may be several hundred ns to several us.

On the other hand, the third battery module 430 may determine whether the fourth battery module 440 has completed transmission of the response data by using the response data received from the fourth battery module 440. For example, the third battery module 430 generates response data generated in response to the control command after the second delay time TD2 has elapsed from the time when the fourth battery module 440 determines that the response data transmission has been completed. The response data of the third battery module 430 may be transmitted bi-directionally to the master controller and the dummy load in a similar manner to the response data of the fourth battery module 440 above. For example, the second delay time TD2 may be a time required to decode response data.

The second battery module 420 may determine whether the third battery module 430 has completed transmission of the response data by using the response data received from the third battery module 430. After the second delay time TD2 has elapsed from the time when the third battery module 430 determines that the response data transmission is complete, the second battery module 420 may transmit the response data generated in response to the control command in both directions. The response data of the second battery module 420 may be bidirectionally transmitted to the master controller and the dummy load in a similar manner to the response data of the third and fourth battery modules 430 and 440.

The first battery module 410 uses the response data received from the second battery module 420 to determine when the second battery module 420 completes transmission of the response data, and a second delay time from the corresponding time point. After (TD2) has elapsed, the response data generated in response to the control command may be transmitted in both directions. The response data of the first battery module 410 may be bidirectionally transmitted to the master controller and the dummy load in a similar manner to the response data of the second to fourth battery modules 420-440.

As set forth above, the battery system according to the inventive concept receives a control command from the battery management unit, regardless of whether each of the plurality of battery modules is selected as a target module, in communication between the battery management unit and a plurality of battery modules, Response data received from the module or generated directly may be transmitted in both directions. Accordingly, it is possible to minimize the difference in power consumption between the plurality of battery modules generated during communication and improve the performance of the battery system.

While example embodiments have been illustrated and described above, it will be apparent to those skilled in the art that modifications and variations of the disclosed example embodiments and other embodiments could be made based on what is disclosed and/or illustrated in this patent document.

What is claimed is:

1. A battery system comprising:
   first to N-th battery modules sequentially coupled in a daisy chain configuration; and
   a master controller coupled to communicate with the first battery module and configured to select at least one target module among the first to N-th battery modules to transmit a control command for the target module,
   wherein the target module transmits the control command received from the master controller, and bidirectionally transmits response data generated in response to the control command, and
   the master controller selects the N-th battery module as the target module firstly, and selects the first battery module as the target module lastly,
   wherein the master controller is coupled to an interface integrated circuit (IC) to communicate with the first battery module, or the first battery module includes a signal converter, and
   wherein the interface IC or the signal converter converts a differential signal to a single-ended signal or converts a single-ended signal to a differential signal.

2. The battery system of claim 1, wherein the master controller receives the N-th response data generated by the N-th battery module firstly, and receives the first response data generated by the first battery module lastly.

3. The battery system of claim 1, wherein the N-th response data generated by the N-th battery module is transmitted to the master controller through the first to N−1 th battery modules, and
   the N−1 th battery module transmits N−1 th response data to the control command bidirectionally after receiving and decoding the N-th response data.

4. The battery system of claim 3, wherein the N−1 th battery module transmits the N-th response data to the N−2 th battery module after a predetermined propagation delay time has elapsed from a point in time when the N−1 th battery module starts receiving the N-th response data.

5. The battery system of claim 3, wherein the N-th battery module transmits the N-th response data to the N−1 th battery module and a dummy load coupled to the N-th battery module.

6. The battery system of claim 3, wherein the N-th battery module transmits the N-th response data to the N−1 th battery module and the master controller coupled to the N-th battery module.

7. The battery system of claim 1, wherein each of the first to N-th battery modules includes a module controller and a plurality of battery cells, and the module controller of the first battery module includes the signal converter.

* * * * *